(12) United States Patent
Rexer et al.

(10) Patent No.: US 8,124,981 B2
(45) Date of Patent: Feb. 28, 2012

(54) RUGGED SEMICONDUCTOR DEVICE ARCHITECTURE

(75) Inventors: Christopher L. Rexer, Mountain Top, PA (US); Gary M. Dolny, Mountain Top, PA (US); Richard L. Woodin, North Yarmouth, ME (US); Carl Anthony Witt, Gorham, ME (US); Joseph Shovlin, Greene, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 528 days.

(21) Appl. No.: 12/136,140

(22) Filed: Jun. 10, 2008

(65) Prior Publication Data
US 2009/0302327 A1   Dec. 10, 2009

(51) Int. Cl.
*H01L 29/15* (2006.01)
(52) U.S. Cl. ... 257/76; 257/481; 257/551; 257/E31.049; 257/E29.008; 257/E29.014; 438/91

(58) Field of Classification Search ............ 257/76, 257/481, E31.049, E29.008, E29.014; 438/91
See application file for complete search history.

(56) References Cited

U.S. PATENT DOCUMENTS

| 6,861,723 | B2 | 3/2005 | Willmeroth | |
|---|---|---|---|---|
| 6,936,850 | B2 | 8/2005 | Friedrichs et al. | |
| 2006/0043379 | A1* | 3/2006 | Zhang et al. | 257/77 |
| 2006/0086939 | A1* | 4/2006 | Carta et al. | 257/77 |
| 2006/0237813 | A1* | 10/2006 | Hshieh et al. | 257/475 |
| 2008/0029838 | A1* | 2/2008 | Zhang et al. | 257/475 |

* cited by examiner

*Primary Examiner* — Julia Slutsker
(74) *Attorney, Agent, or Firm* — Hiscock & Barclay, LLP

(57) ABSTRACT

A wide bandgap silicon carbide device has an avalanche control structure formed in an epitaxial layer of a first conductivity type above a substrate that is connected to a first electrode of the device. A first region of a second conductivity type is in the upper surface of the epitaxial layer with a connection to a second electrode of the device. A second region of the first conductivity type lies below the first region and has a dopant concentration greater than the dopant concentration in the epitaxial layer.

24 Claims, 14 Drawing Sheets

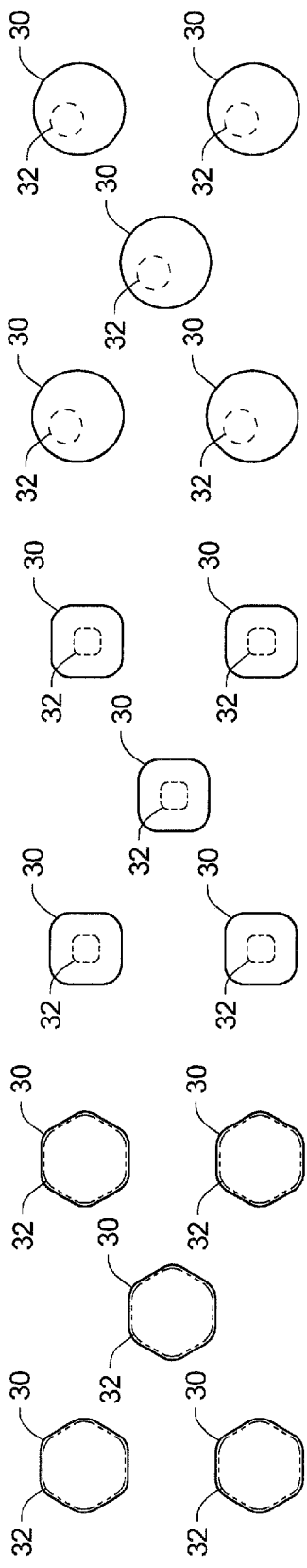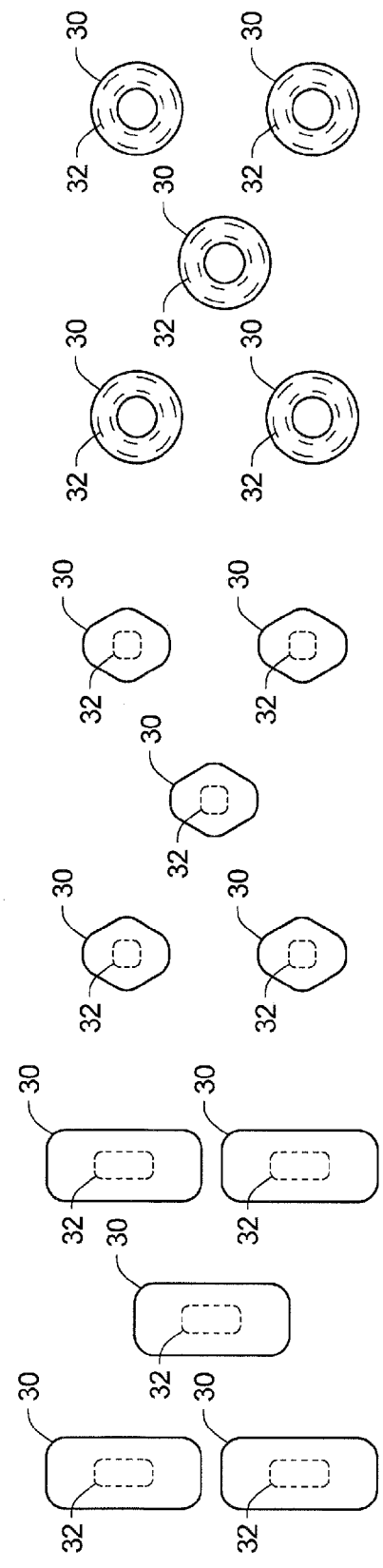

US 8,124,981 B2

RUGGED SEMICONDUCTOR DEVICE ARCHITECTURE

FIELD OF THE INVENTION

The present invention relates to reverse bias electric field shaping in active regions in wide bandgap devices.

BACKGROUND OF THE INVENTION

Power semiconductor devices are widely used to carry high currents and block high voltages. Most power semiconductor devices are fabricated from silicon. However, wide bandgap materials, such as silicon carbide and gallium nitride, offer a number of advantages including higher breakdown field and improved thermal characteristics. As used herein, the term power device means a semiconductor device which is capable of dissipating over 1 watt in normal operation.

Avalanche breakdown is the phenomenon of current multiplication when a semiconductor device is subject to high electric fields. In order to prevent damage to the device it is desirable that the avalanche breakdown occur over a large area, thereby reducing the avalanche current density. Discontinuities at the edges of semiconductor devices create locally large electric fields, tending to produce avalanche breakdown preferentially at the edge instead of uniformly distributed over the entire active area of the device. Edge termination structures are designed and fabricated to remove or smooth the discontinuities at the edge, thereby reducing the otherwise large fields at that location.

In conventional (i.e. Si) semiconductor devices, structures within an active region can be fabricated which will preferentially reduce the breakdown voltage within the active region compared to the edges, forcing breakdown into the active region. Such structures are often formed by the process of diffusion of dopants, which allows a wide range of control over dopant depth and distribution, and thereby control of the avalanche breakdown voltage and location.

Dopant diffusion in wide bandgap semiconductors such as silicon carbide (SiC) is very slow, making it difficult to fabricate deep structures. It is therefore difficult to create regions with different breakdown voltages. As a result, breakdown in wide bandgap semiconductor devices tends to occur at the edges of the devices where electric fields are largest.

Therefore, it can be appreciated that a wide bandgap semiconductor device, with an active region and a termination region outside the active region, in which avalanche breakdown threshold is controlled by the active region rather than by the termination region, is desirable.

SUMMARY OF THE INVENTION

The invention comprises, in one form thereof, a wide bandgap semiconductor device having a lightly doped layer of a first conductivity type having an active region and a termination region, the lightly doped layer having first and second opposite surfaces, a first region of a second conductivity type opposite to the first conductivity type in the first surface of the lightly doped layer in the active region, a second region of the first conductivity type positioned at least partially between the first region and the second surface of the lightly doped layer, and a first metal layer on the first surface of the lightly doped layer, the first metal layer and the first surface forms a Schottky barrier region where the first metal layer contacts areas of the first conductivity type, wherein the dopant concentration in the second region is greater than the dopant concentration in the lightly doped layer.

In another form, the invention includes a method for forming a wide bandgap semiconductor device. The method comprises the steps of having a lightly doped layer of a first conductivity type which includes an active region and a termination region, the lightly doped layer having first and second opposite surfaces, forming a first region of a second conductivity type opposite to the first conductivity type in the first surface of the lightly doped layer in the active region, forming a second region of the first conductivity type positioned at least partially between the first region and the second surface of the lightly doped layer, and forming a first metal layer on the first surface of the lightly doped layer, the first metal layer and the first surface forms a Schottky barrier region where the first metal layer contacts areas of the first conductivity type, wherein the dopant concentration in the second region is greater than the dopant concentration in the lightly doped layer.

BRIEF DESCRIPTION OF THE DRAWINGS

The aforementioned and other features, characteristics, advantages, and the invention in general will be better understood from the following more detailed description taken in conjunction with the accompanying drawings, in which:

FIGS. 7A, 7B, 7C, 7D, 7E, and 7F are diagrammatical top views of various embodiments of two regions in the wide bandgap devices of FIGS. 1 and 6.

Figure 1A:
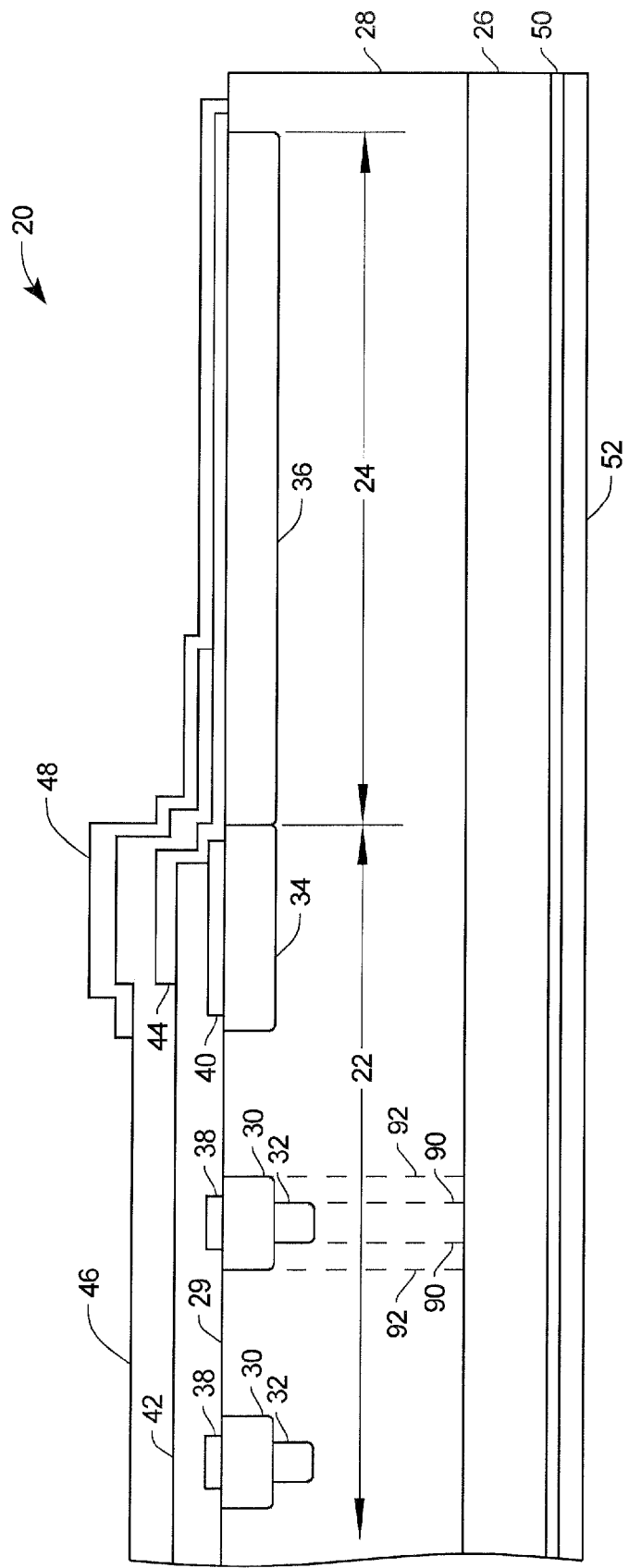
FIG. 1A is a diagrammatical side view of a portion of a wide bandgap device according to an embodiment of the present invention.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

Turning now to the drawings, FIG. 1A is a diagrammatical side view of a portion of a wide bandgap device 20 according to an embodiment of the present invention, which, in the embodiment shown in FIG. 1A, is a silicon carbide (SiC) Schottky diode, having an active region 22 and a termination region 24. The Schottky diode 20 is formed on a highly doped SiC substrate 26 with a lightly doped epitaxial (epi) layer 28 grown thereon. The substrate 26 and the epi layer 28 are of a first conductivity type, which in the embodiment shown in FIG. 1A is N type, but it will be understood that the first conductivity type could also be P type, although N type substrates are generally used because P type SiC has lower mobility than N type SiC, and it is therefore difficult to achieve a low resistance substrate with P type SiC. A Schottky barrier anode 42 lies on portions of the top surface 29 of the epi layer 28, and forms a Schottky barrier junction on the portions of the top surface 29 that it is in contact with. The Schottky barrier anode 42 may be tungsten, titanium, a titanium-tungsten mixture, rhenium, nickel, nickel silicide, gold, platinum, or molybdenum.

Formed in the upper portion of the epi layer 28 are regions 30 of a second conductivity type, opposite to the first conductivity type, which in this embodiment is P type. The regions 30 are P+, and formed below the P+ regions 30 are N regions 32 which have a higher dopant concentration than the epi layer 28, and which, in one embodiment of the present invention, do not extend laterally beyond the vertical edges of the P+ regions 30. At the edge of the active region 22 is another P+ region 34 which is adjacent to a P region 36 in the termination region 24. In one embodiment of the present invention the P+ regions 30, the N regions 32, and the P region 36 are formed by ion implantation.

Above the P+ regions 30 are ohmic contacts 38, and above the P+ region 34 is another ohmic contact 40 in one embodiment of the invention, all of which are ohmic contacts to the Schottky barrier anode 42 and may be of aluminum-nickel, aluminum-titanium, or only aluminum. A dielectric layer 44 lies above the P region 36 and extends into the active region 22 over the edge of the Schottky barrier anode 42. A top metal layer 46 covers the Schottky barrier anode 42 and extends over a portion of the dielectric layer 44 in the termination region 24. A passivation layer 48 overlaps the dielectric layer 44 in the termination region 24 and extends over the edge of the top metal layer 46 in the active region 22.

Formed on the back side of the substrate 26 is an ohmic contact 50 and a conductive back metal layer that forms a cathode 52.

Figure 1B:
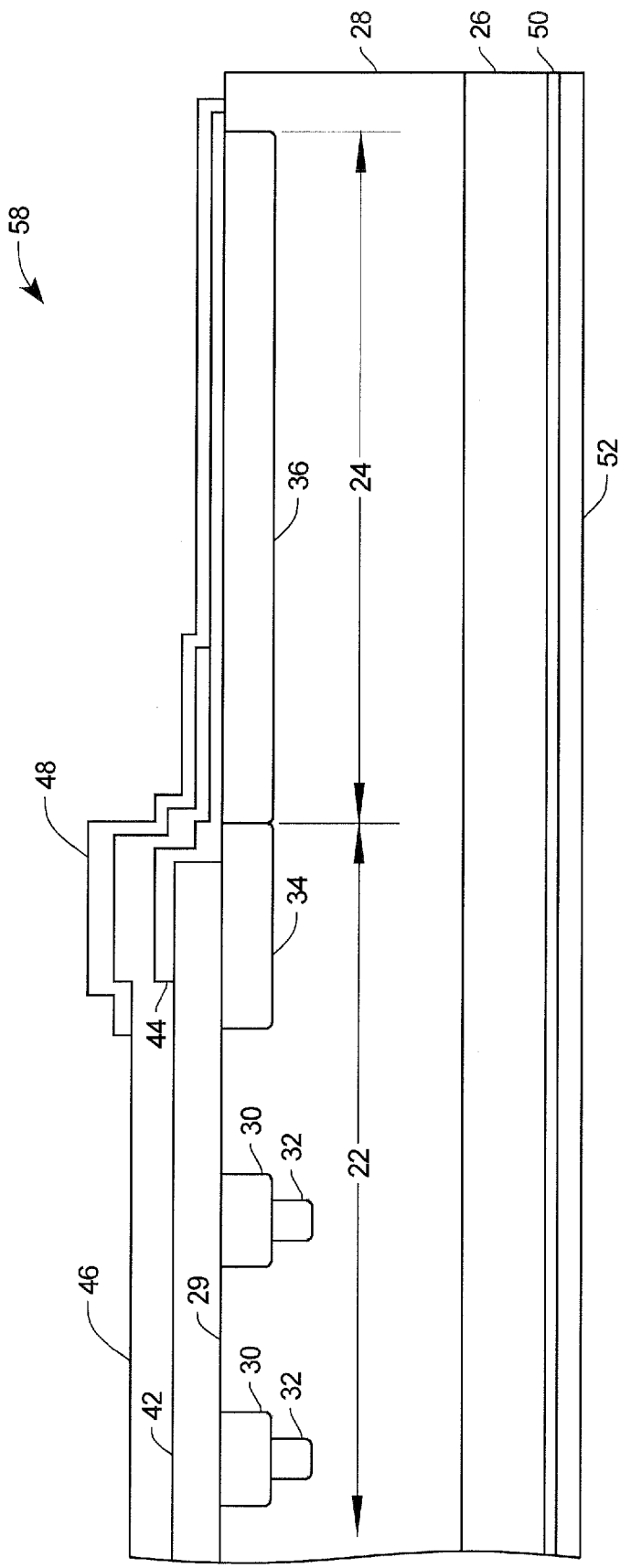
FIG. 1B is a diagrammatical side view of a portion of a wide bandgap device according to another embodiment of the present invention.

FIG. 1B is a diagrammatical side view of a portion of a wide bandgap device 58 according to another embodiment of the present invention in which the ohmic contacts 38 and 40 are not present. Although the ohmic contacts 38 and 40 provide a low resistance connection between the Schottky barrier anode 42 and the P+ regions and thus enhance the current surge characteristics of the wide bandgap device 20, their presence limits the lateral spacing between adjacent P+ regions 30 due to the need for separate masks for the P+ regions 30 and the ohmic contacts 38. For devices which do not require high current surge characteristics, the omission of the ohmic contacts 38 allows closer spacing between the P+ regions which decreases the leakage current through the wide bandgap device 58.

Figure 2A:
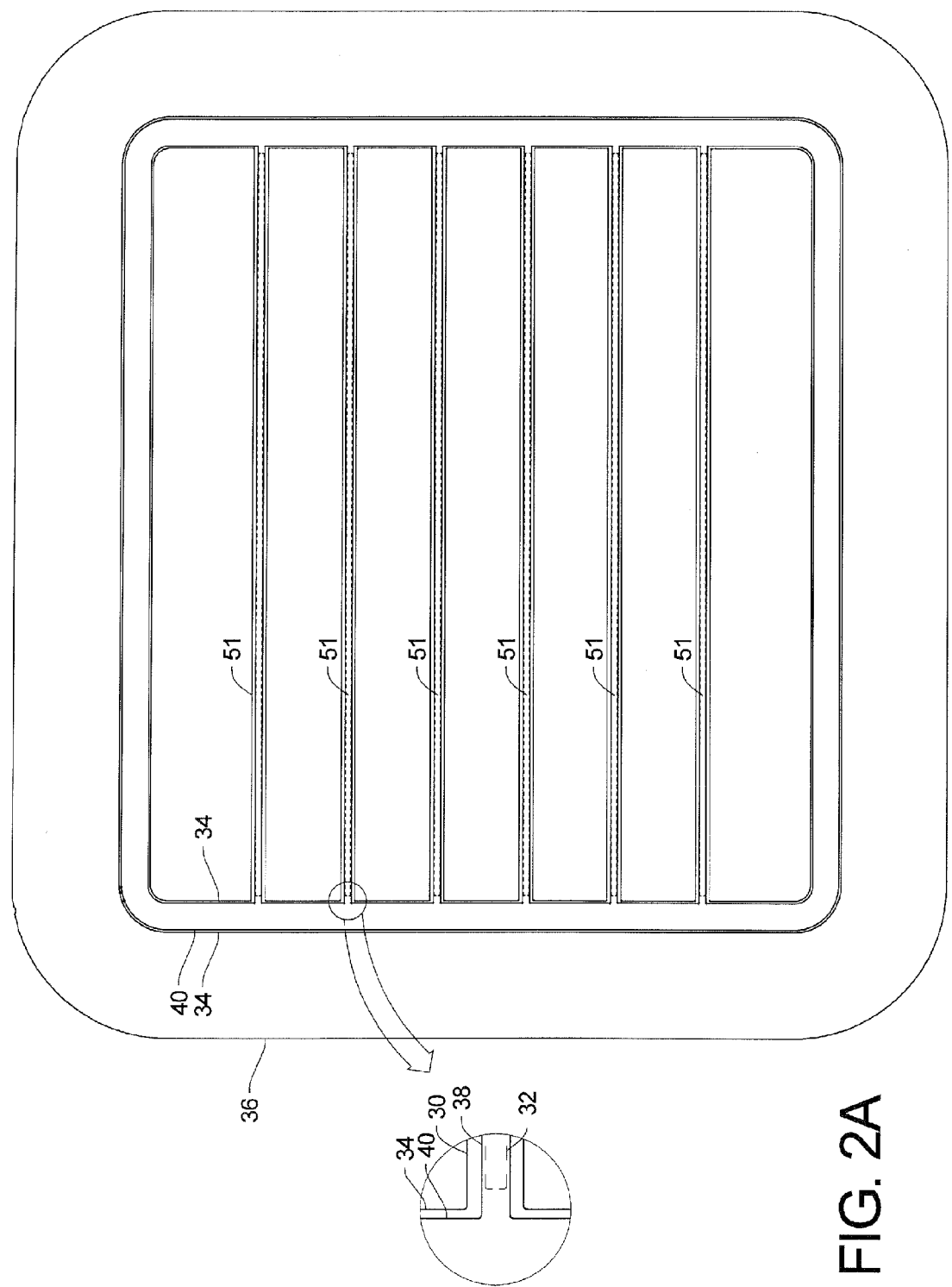
FIGS. 2A, 2B, 2C, and 2D are top diagrammatic views of four different layouts of the wide bandgap device of FIG. 1A.
Figure 2B:
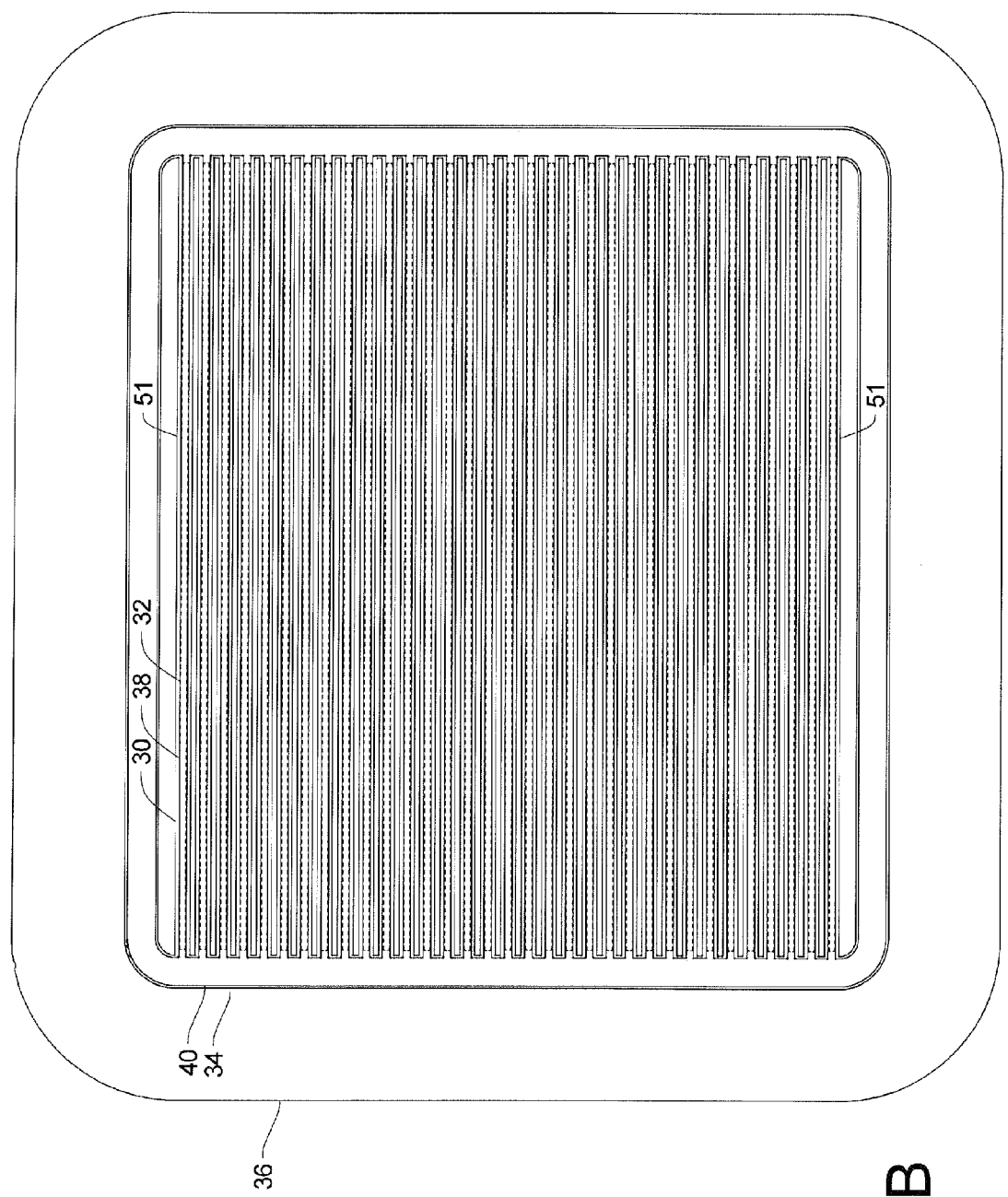

FIGS. 2A-2D are top diagrammatic views of the Schottky diode 20 without the Schottky barrier anode 42, the dielectric layer 44, the top metal layer 46, and the passivation layer 48. The four figures are four different layouts of the P+ regions 30 along with the N regions 32 and the ohmic contacts 38. The P+ regions 30 and the N regions 32 are closed figures or the complement of closed figures, all with rounded corners. In FIG. 2A polygon shaped closed figures in the form of parallel stripes 51 are formed by P+ regions 30 over N regions 32. The P+ regions 30 have a separation gap of 37 μm and a width of 7 μm in one embodiment of the invention. In FIG. 2B the same stripes with a separation gap of 2.5 μm are depicted in another embodiment of the invention. Although not shown, the separation gap between the stripes can be 1 μm in some embodiments. The intended application of the SiC Schottky diode 20 will determine the separation between the stripes. With more area allocated to the P+ regions as in FIG. 2B, the operational Schottky barrier area is less than the embodiment shown in FIG. 2A resulting in a higher forward voltage drop due to the increased resistance. However, there is more area to control the device breakdown voltage reducing the possibility of failures compared to the embodiment shown in FIG. 2A.

Figure 2C:
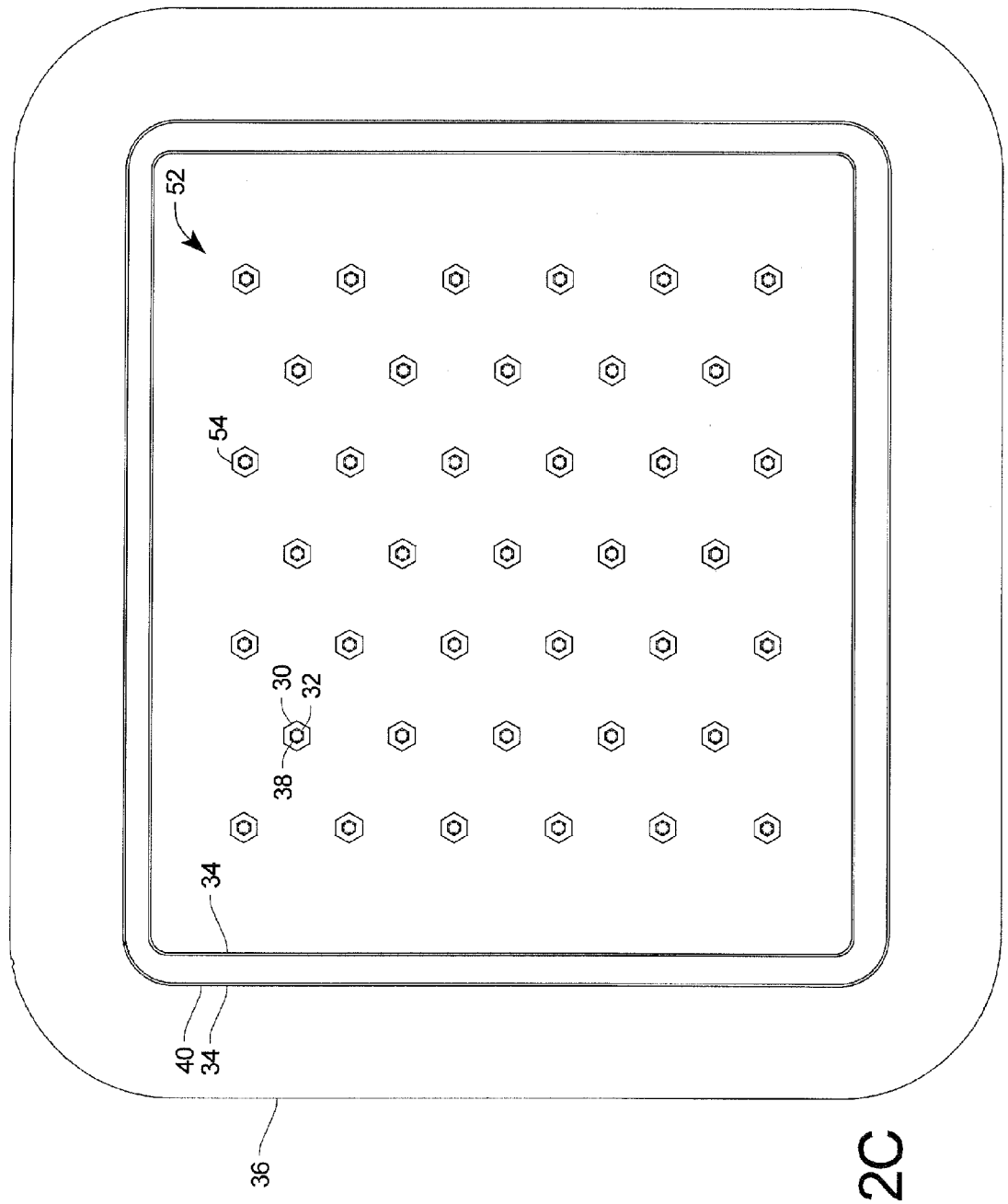
Figure 2D:
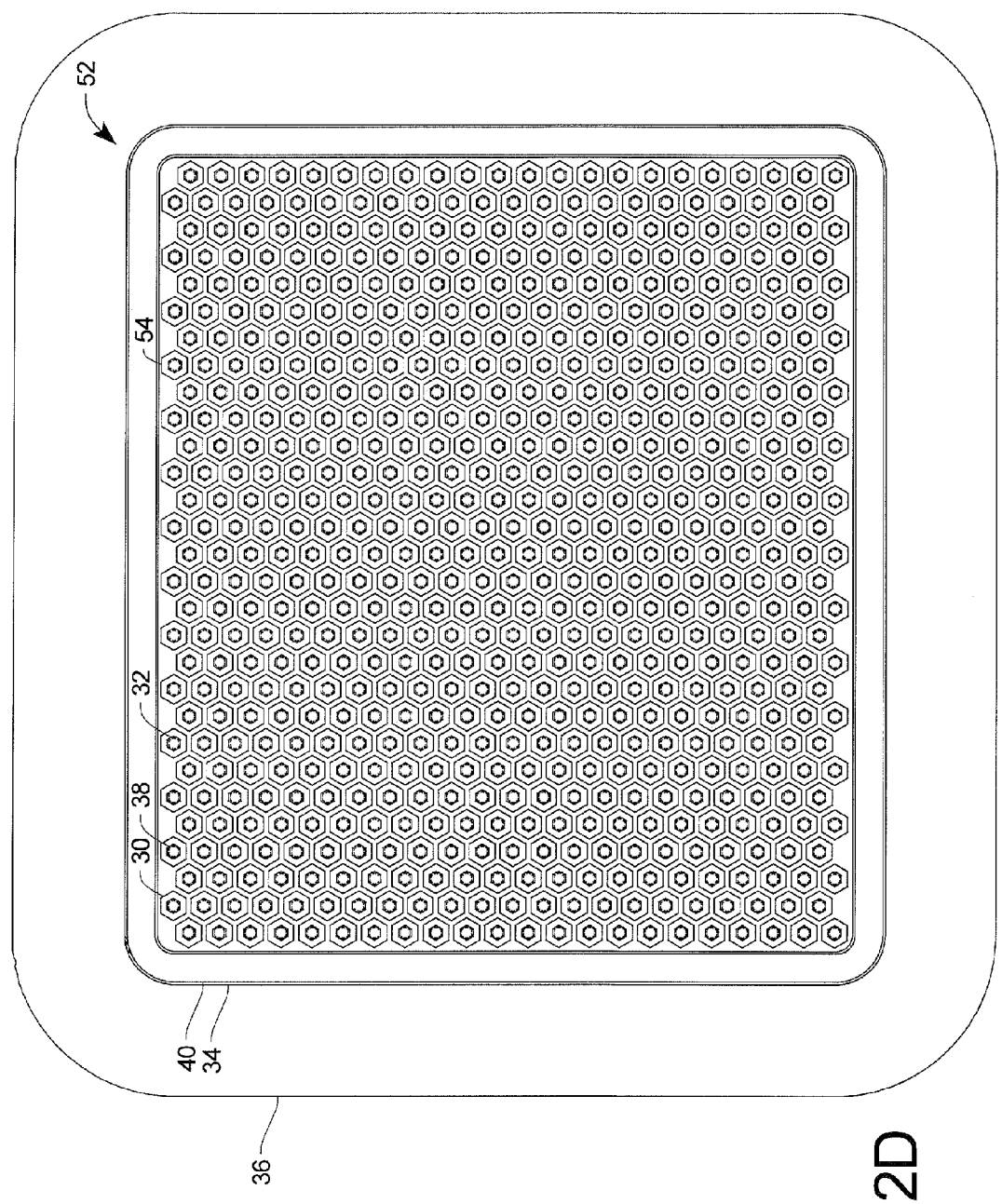

FIGS. 2C and 2D have a regular pattern 52 of P+ regions 30, with their associated N regions and P contacts 38, in the form of regular polygons, which, in FIGS. 2C and 2D are hexagons. The relative spacing between the adjacent P+ regions 30 corresponds to the spacing shown in FIGS. 2A and 2B, respectively. The hexagonal shapes provide more efficient use of the Schottky barrier area than the stripes 51 of FIGS. 2A and 2B. The forward bias current spreads under the hexagonal regions to a greater extent than with the stripes 51, and as a result has less of an impact on the forward voltage drop of the Schottky diode 20.

Figure 3:
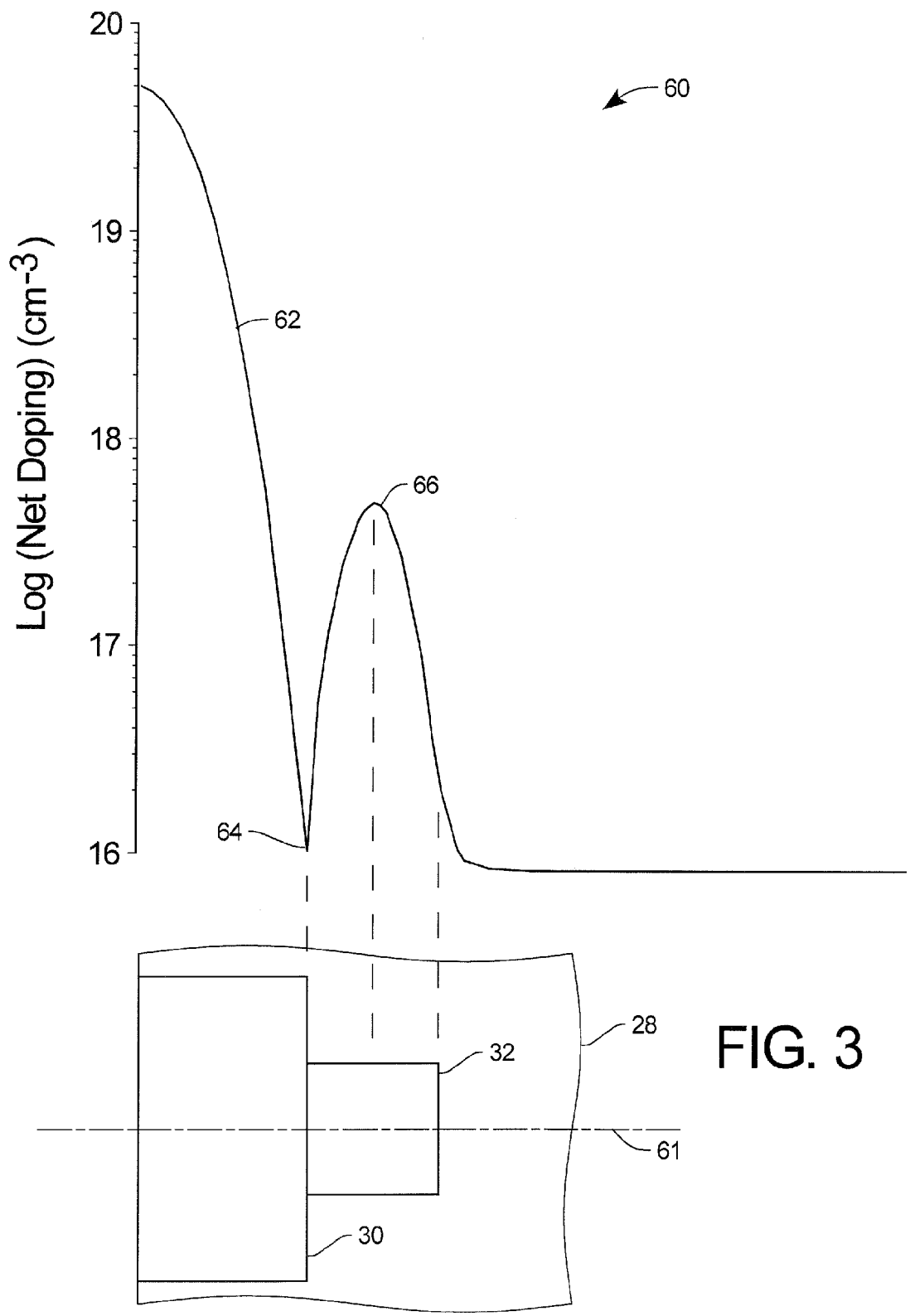
FIG. 3 is a plot of an example of possible dopant concentration levels in three regions in the wide bandgap device of FIG. 1A.

FIG. 3 is a plot 60 of an example of possible dopant concentration levels along a center line 61 in the P+ region 30, the N region 32 and the epi layer 28 for a wide bandgap device 20 having a breakdown voltage of about 700 to 800 volts. The vertical axis of the plot 60 is logarithmic with numbers indicating the net (absolute) doping concentration (atoms per cubic centimeter). The concentration of the P+ region 30 at the upper surface of the epi layer 28 begins at approximately $5 \times 10^{19}$ cm$^{-3}$, as shown in region 62 of the plot 60, and changes from P type to N type at the junction formed between the P+ region 30 and the N region 32 at the minimum 64 of the plot 60. The peak N type dopant concentration, which occurs at approximately the center vertically (in FIG. 1A) of the N region 32, is about $5 \times 10^{17}$ cm$^{-3}$ at position 66 on the plot 60, and then decreases to the N dopant concentration of slightly less than $10^{16}$ cm$^{-3}$ in the epi layer 28. The maximum electric field is at the P-N junction 64 where the avalanche breakdown of the diode 20 initiates. The doping profiles are designed so that this avalanche breakdown voltage is less than that of the edge termination.

In order for avalanche breakdown to occur in the active region 22 before it occurs in the termination region 24 and provide the desired breakdown voltage for the device 20, the level of dopant in the P+ regions 30 and the N regions 32 are selected such that the avalanche breakdown voltage in the active region 22 is about 15 to 20 percent less than the avalanche breakdown voltage in the termination region 24.

Figure 4:
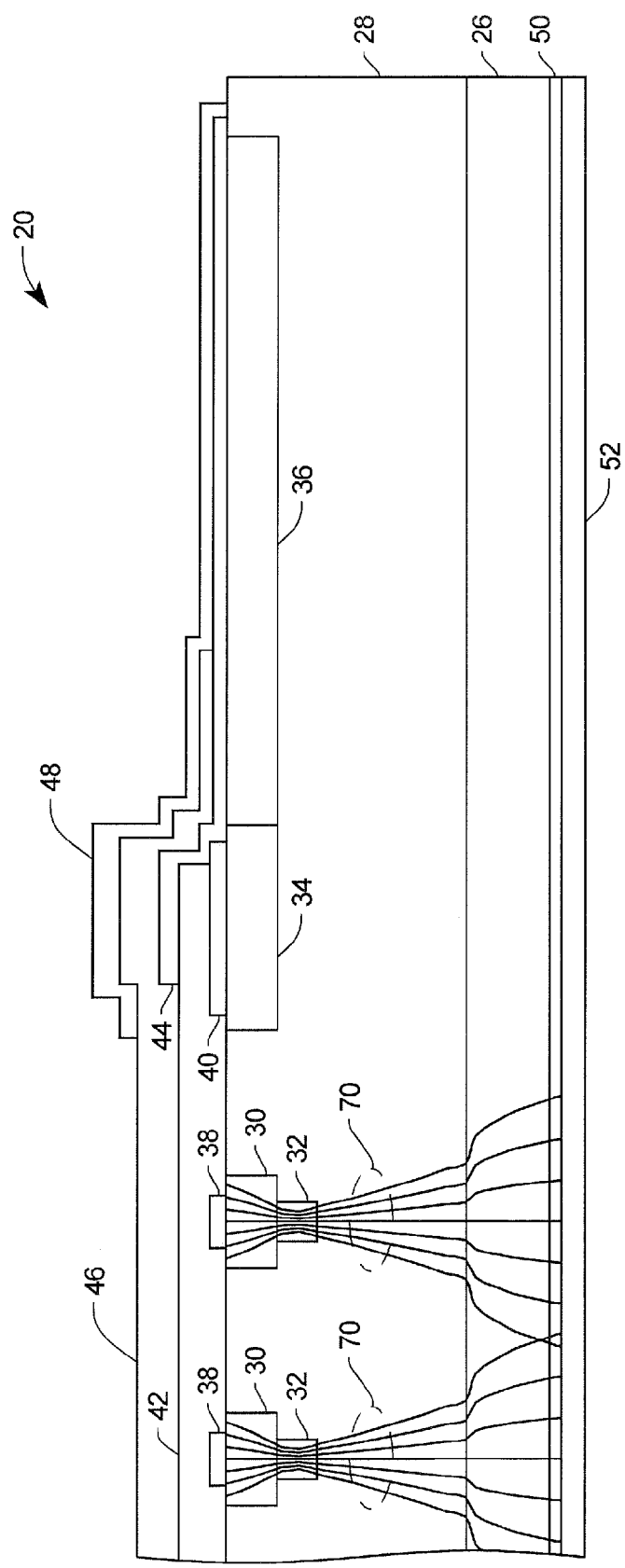
FIG. 4 is FIG. 1A showing the probable avalanche current dispersal.

FIG. 4 is FIG. 1A with the probable avalanche current dispersal shown by the current lines 70. As can be seen, the avalanche current initiated in the region of the junction of the P+ region 30 and the N region 32 disperses to some extent in the epi layer 28, and then disperses even more in the substrate 26. Those skilled in the art will understand that the relative depths of the layers and regions shown in the drawings are not to scale, and that the current lines 70 are shown only to indicate the estimated shape and relative dispersal of the avalanche current in the various regions of the diode 20.

Minor variations in dopant concentrations in the striped and the polygonal regions 30, 32 in FIGS. 2A-2D will result in non-uniform initiation of the avalanche breakdown, often at a single location. Joule heating at such a location during avalanche breakdown leads to a local increase in breakdown voltage. Further breakdown will then preferentially occur in other areas, eventually leading to avalanche breakdown spread over the entire active region 22.

The area of the active region 22 is generally greater than the area of the termination region 24, and thus there is more SiC material to absorb the avalanche breakdown energy, and in that sense the semiconductor device 20 is therefore more rugged than conventional semiconductor devices.

Figure 5A:
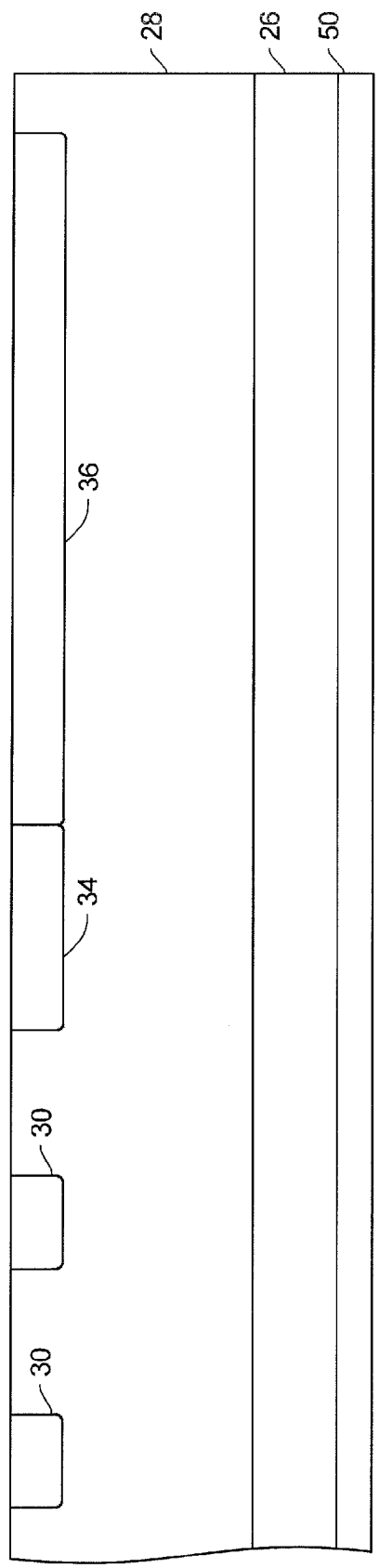
FIGS. 5A, 5B and 5C show selected process stages for fabricating the wide bandgap device of FIG. 1A according to one embodiment of the present invention.
Figure 5B:
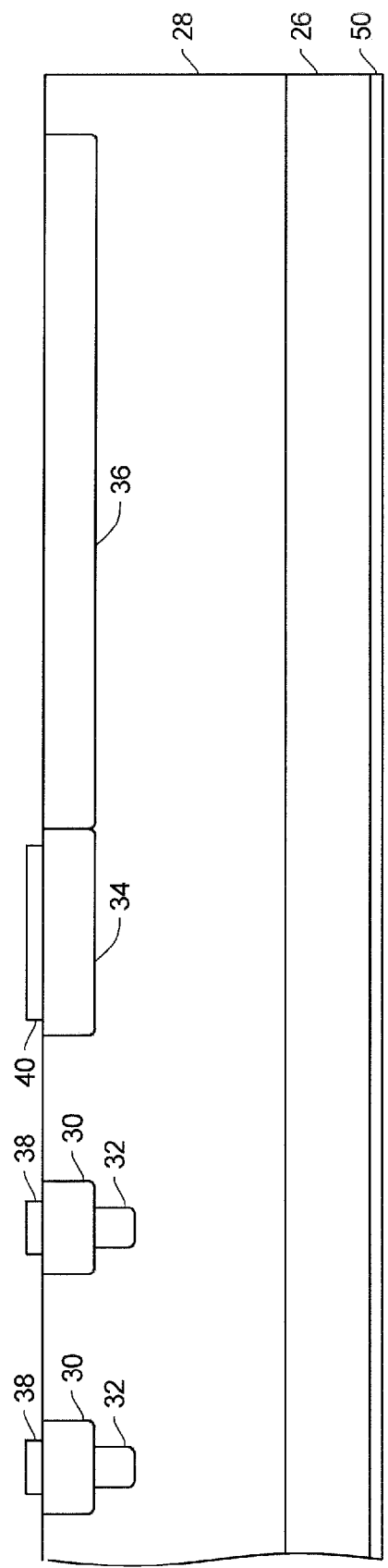
Figure 5C:
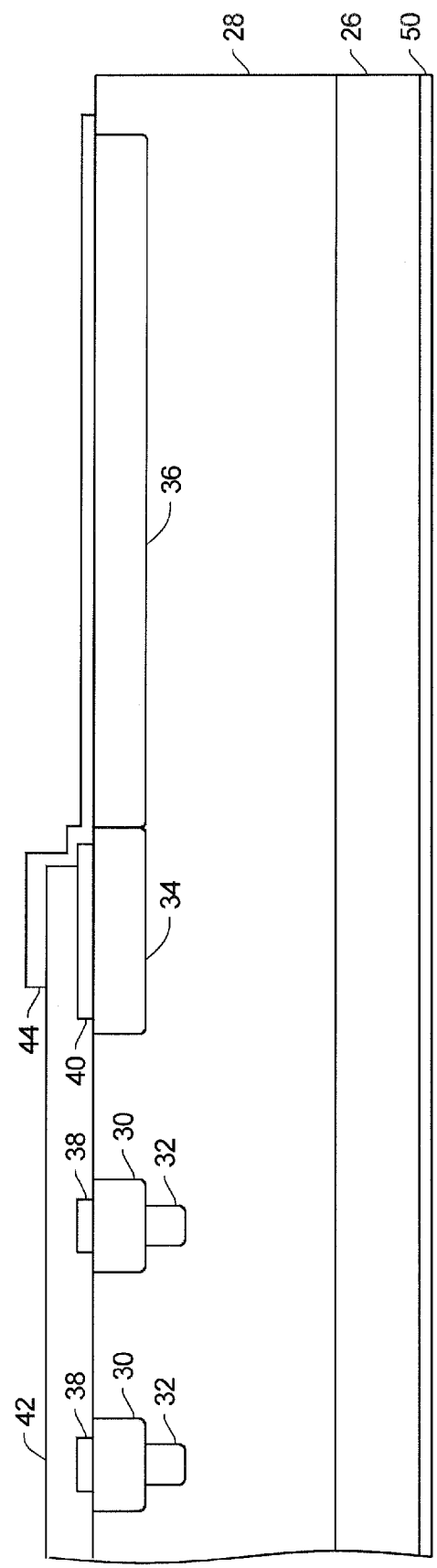

FIGS. 5A-5C show selected process stages for fabricating the diode 20 according to one embodiment of the present invention. It will be understood that variations can be made in the processing of the diode 20, and that the description below is a description of one such process. With reference to FIG. 5A, after the N− epi layer 28 is grown on the N+ substrate 26, the P region 36 in the termination region 24 is formed, which may be formed by ion implantation at a dose level of about $10^{13}$ cm$^{-2}$. Then the P+ regions 30 and 34 are formed, which also may be formed by ion implantation, in another operation at a dose of about $10^{15}$ cm$^{-2}$. Due to the processes used in forming the various regions in the epi layer 28, the top surface of the epi layer 28 may not be completely flat, but may have depressions in some areas of the top surface.

In wide bandgap devices 20 in which the wide bandgap material is SiC, aluminum is used as the P type dopant in one embodiment of the present invention. An alternative P type dopant is boron. In another embodiment of the invention the wide bandgap material is gallium nitride, in which case the P type dopants are customarily magnesium or carbon, and said N type dopants are customarily silicon or tellurium.

In FIG. 5B the N regions 32 are formed by implanting nitrogen through the P+ regions 30 using a separate mask because the nitrogen is a lighter dopant than the aluminum and will tend to extend laterally more than the aluminum if the same mask were to be used for both implants. The P+ and N implant doses are chosen so as to create an N doped region 32 beneath the P doped region 30 of a higher concentration than the epi layer 28. Activation of the implanted dopants is achieved by annealing at elevated temperature. The ohmic contacts 38, 40 are formed in another mask operation and the ohmic contact 50 is formed on the backside of substrate 26. The ohmic contact metals are then annealed prior to forming the Schottky barrier anode 42.

The ohmic contacts 38 and 40 may be aluminum, an aluminum-nickel alloy or a aluminum-titanium alloy. In one embodiment of the invention the ohmic contact 50 is nickel, and the back metal layer 52 (shown in FIG. 1A) is three metal layers, a titanium layer next to the nickel ohmic contact 50, a nickel layer next to the titanium layer, and a silver layer next to the nickel layer.

FIG. 5C shows the Schottky barrier anode 42 and the dielectric layer 44 in place which requires two separate masking operations. After the structure shown in FIG. 5C is formed, the top metal 46 and the passivation layer 48 are deposited and patterned. The back metal cathode 52 is deposited forming the structure shown in FIG. 1A.

Figure 6:
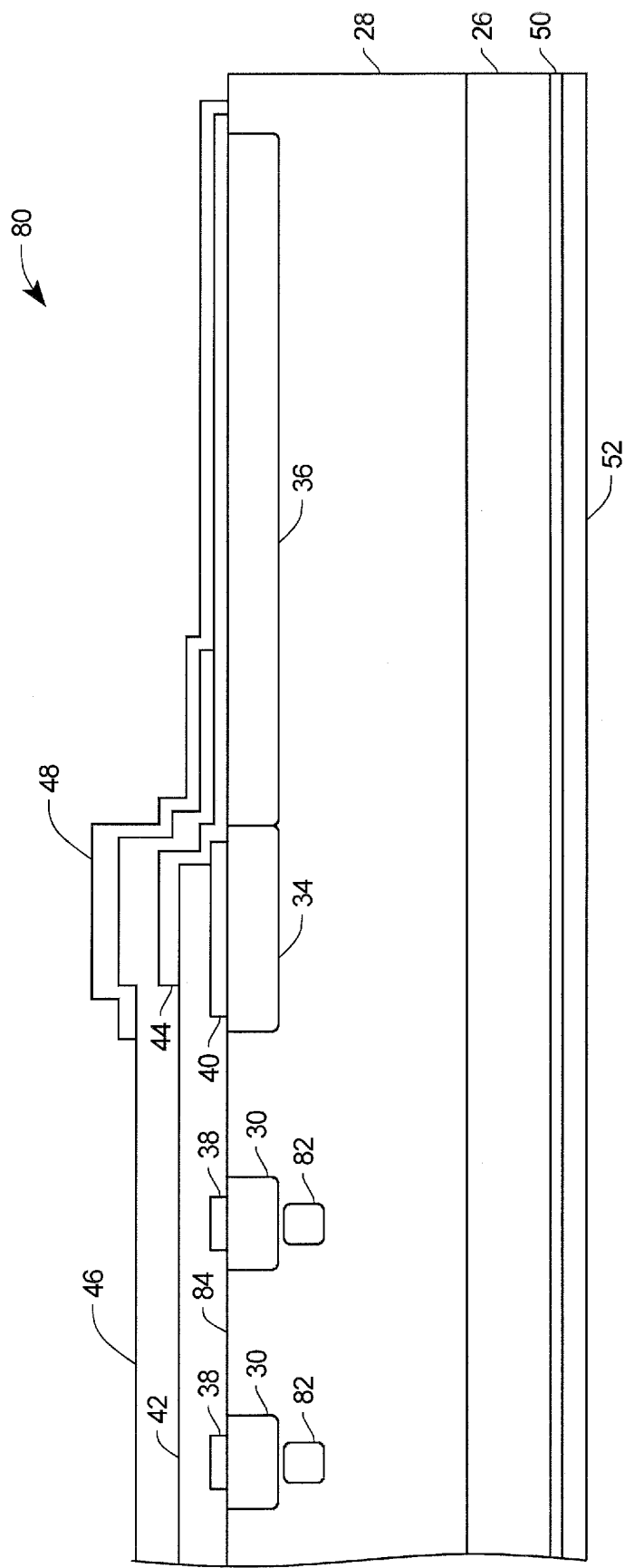
FIG. 6 is a diagrammatical side view of a portion of a wide bandgap device according to another embodiment of the present invention.

FIG. 6 is a diagrammatical side view of a portion of a wide bandgap device according to another embodiment 80 of the present invention in which the N regions 32 in FIG. 1A have been spaced apart vertically from the P+ regions 30. These N regions are shown as regions 82 in FIG. 6.

FIGS. 7A-7F are top diagrammatical views of various configurations of the P+ regions 30 and their associated N regions 32. In FIG. 7A the P+ regions 30 are closed figures in the form of regular polygons, in this case hexagonal, with rounded corners, and the N regions 32 have the same planar shape but are slightly smaller. FIG. 7B shows closed figures in the form of squares with rounded corners for both the P+ regions 30 and the N regions 32, and FIG. 7C shows closed figures in the form of round P+ regions 30 and N regions 32. In FIG. 7C, the N regions 32 are not located in the center of the P+ regions 30, but they also do not extend outside of the P+ regions 30. FIG. 7D shows closed figures in the form of rectangular P+ regions 30 and N regions 32. These rectangular regions can be considered the superposition or union of two or more squares which overlap and are in a straight line. In FIG. 7E the P+ regions 30 are closed regions in the form of polygons with rounded corners which could also be the intersection of two hexagons with rounded corners, and FIG. 7F shows P+ regions 30 and N regions 32 as rings which are also the complement or difference of two closed figures in the form of circles with different radii.

In all of the various forms of the P+ regions 30 and their corresponding N regions 32 described above and shown in their respective drawings, the orthographic projection of the N regions 32 onto the bottom surface of the epi layer 28 (which is in contact with the top surface of the substrate 26), shown by the dashed lines 90 in FIG. 1A, do not extend outside of the orthographic projection of the P+ regions 30 onto the bottom surface of the epi layer 28, shown by the dashed lines 92 in FIG. 1A. Stated another way, the N regions 32 lie within the "shadow" of the P+ regions 30 (as in a top view of the wide bandgap device 20). However, the present invention is also applicable to embodiments in which the N regions 32 do not lie within the shadow of the P+ regions 30. FIGS. 8A-8H are different forms of such embodiments. However, in these embodiments of FIGS. 8A-8H the lateral extensions of the N regions 32 which are outside the shadow of the P+ regions 30 will increase the leakage current compared to the wide bandgap device 20 shown in FIG. 1A, but the avalanche breakdown can still occur in the active region 22 instead of the termination region 24 with the proper doping levels in the P+ regions 30 and the N regions 32 as described above.

Figure 8A:
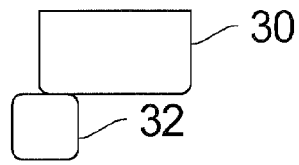
FIGS. 8A, 8B, 8C, 8D, 8E, 8F, 8G, and 8H are diagrammatical side views of alternative embodiments of the placement and/or shape of the N regions shown in FIG. 1A.
Figure 8B:
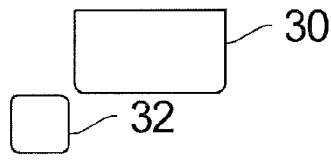
Figure 8C:
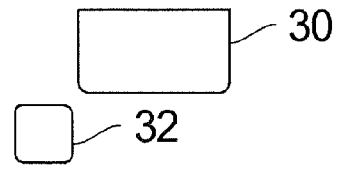
Figure 8D:
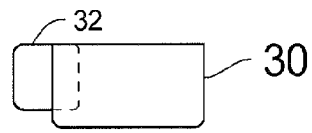
Figure 8E:
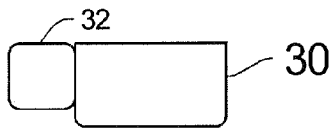
Figure 8F:
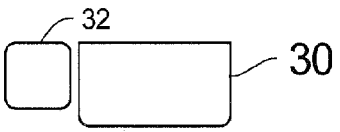
Figure 8G:
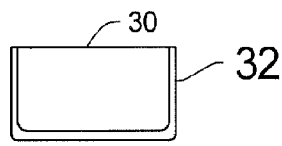
Figure 8H:
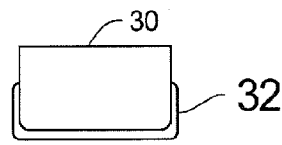

In FIG. 8A the N region 32 is partially within the shadow of the P+ region 30 and in contact with the P+ region 30. In FIG. 8B the N region 32 of FIG. 8A is moved to the left so that no part of the N region 32 is within the shadow of the P+ region 30. FIG. 8C is FIG. 8B with the N region 32 moved down. FIGS. 8D-8F shown the N region 32 having a top surface in the same plane as the top surface of the P+ region 30. In FIG. 8D the N region 32 partially overlaps the P+ region 30, in FIG. 8E the N region 32 is in contact with the edge of the P+ region 32, and in FIG. 8F the N region 32 is separated from the P+ region 30. FIGS. 8G and 8H show N regions 32 which partially surround the P+ regions 30. In FIG. 8G the N region 32 surrounds the sides of P+ region 30 and extends to the top surface of the P+ region 30, while in FIG. 8H the N region 32 partially surrounds the sides of the P+ region 30, but does not extend to the top surface of the P+ region 30.

It will be appreciated by those skilled in the art that the doped regions may be shown in the drawings and described as shapes with sharp borders in the specification and figures to facilitate the description of the present invention, however, the actual physical distributions of the dopants is a gradient at the edges of the doped regions which do not have abrupt boundaries and which form rounded corners. Therefore, the geometric shapes described in the description and the claims include deviations from these geometric shapes in the doped regions resulting from the physical distributions of the dopants.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

Other modifications are also deemed within the scope of the invention. For example, the embodiments described above have one epitaxial layer formed on a substrate. However, the substrate could be implanted to form a lightly doped layer in place of the epi layer 28. In another modification, the substrate 26 could be removed prior to forming the ohmic contact 50 and the back metal 52 on the epi layer 28.

The invention claimed is:

1. A wide bandgap device comprising:
    a lightly doped layer of a first conductivity type having an active region and a termination region, said lightly doped layer having first and second opposite surfaces;
    at least two first regions of a second conductivity type opposite to said first conductivity type in said first surface of said lightly doped layer in said active region, the two first regions having a bottom and being isolated from one another by said lightly doped layer;
    at least two second regions of said first conductivity type, each vertically stacked under one of the first regions and positioned at least partially between the bottom of its respective said first region and said second surface of said lightly doped layer; and
    a first metal layer on said first surface of said lightly doped layer, said first metal layer and said first surface form a Schottky barrier where said first metal contacts areas of said first conductivity type;
    wherein said dopant concentration in said second region is greater than the dopant concentration in said lightly doped layer.

2. The device of claim 1 wherein each of said first regions are in contact with their respective said second regions.

3. The device of claim 1 wherein said first regions are not in contact with their respective said second regions.

4. The device of claim 1 wherein said active region is enclosed by said termination region.

5. The device of claim 4 wherein the avalanche breakdown voltage in said first and second regions is less than the avalanche breakdown voltage in said termination region.

6. The device of claim 1 wherein an orthographic projection of one of said first regions onto said second surface forms a closed figure with rounded corners.

7. The device of claim 1 wherein an orthographic projection of one of said second regions onto said second surface does not extend outside the perimeter of an orthographic projection of its respective said first region onto said second surface.

8. The device of claim 1 wherein said wide bandgap device comprises silicon carbide.

9. A wide bandgap device comprising:
    a lightly doped layer of a first conductivity type having an active region and a termination region, said lightly doped layer having first and second opposite surfaces;
    at least two first regions of a second conductivity type opposite to said first conductivity type in said first surface of said lightly doped layer in said active region, the two first regions having a bottom and being isolated from one another by said lightly doped layer;
    at least two second regions of said first conductivity type, each vertical stacked under one of the first regions and positioned proximate to said first region and at least partially beneath the bottom of its respective said first region; and
    a first metal layer on said first surface of said lightly doped layer, said first metal layer and said first surface form a Schottky barrier where said first metal contacts areas of said first conductivity type;
    wherein said dopant concentration in said second region is sufficiently greater than the dopant concentration in said lightly doped layer for avalanche breakdown to occur in said active region prior to avalanche breakdown occurring in said termination region.

10. The device of claim 9 wherein said first regions are in contact with their respective said second regions.

11. The device of claim 9 wherein said first regions are not in contact with their respective said second regions.

12. The device of claim 9 wherein an orthographic projection of each of said first and second regions onto said bottom surface forms closed figures with rounded corners.

13. The device of claim 9 wherein an orthographic projection of one of said second region onto said second surface does not extend outside the perimeter of an orthographic projection of its respective said first region onto said second surface.

14. An avalanche breakdown control region in a wide bandgap layer of a first conductivity type comprising:
    at least two first regions of a second conductivity type opposite to said first conductivity type in a top surface of said wide bandgap layer, said first region having a low resistance connection to a first metal layer, and a bottom surface of said wide bandgap layer having a low resistance connection to a second metal layer, the two first regions having a bottom and being isolate from one another by said wide bandgap layer; and
    at least two second regions of said first conductivity type, each vertically stacked under one of the first regions and positioned at least partially between the bottom of its respective said first region and said bottom surface of said wide bandgap layer, the dopant concentration of said second region being greater than the dopant concentration of said wide bandgap layer.

15. The device of claim 14 wherein each said first region is in contact with its respective said second region.

16. The device of claim 14 wherein each said first region is not in contact with its respective said second region.

17. The device of claim 14 wherein an orthographic projection of each of said first and second regions onto said bottom surface forms closed figures with rounded corners.

18. The device of claim 14 wherein an orthographic projection of one of said second regions onto said bottom surface does not extend outside the perimeter of an orthographic projection of its respective said first region onto said bottom surface.

19. A method of forming a wide bandgap device comprising the steps of:
    forming a lightly doped layer of a first conductivity type which has an active region and a termination region, said lightly doped layer having first and second opposite surfaces;
    forming at least two first regions of a second conductivity type opposite to said first conductivity type in said first surface of said lightly doped layer in said active region, the two first regions having a bottom and being isolated from one another by said lightly doped layer;
    forming at least two second regions of said first conductivity type, each vertically stacked under one of the first regions and positioned at least partially between the bottom of its respective said first region and said second surface of said lightly doped layer; and
    forming a first metal layer on said first surface of said lightly doped layer, said first metal layer and said first surface form a Schottky barrier region where said first metal layer contacts areas of said first conductivity type;
    wherein said dopant concentration in said second region is greater than the dopant concentration in said lightly doped layer.

20. The method of claim 19 wherein said second regions are formed such that it is they are in contact with said first region.

21. The method of claim 19 wherein said second regions are formed such that it is they are not in contact with said first region.

22. The method of claim 19 wherein said active region is enclosed by said termination region.

23. The method of claim 22 wherein the avalanche breakdown voltage in said first and second regions is less than the avalanche breakdown voltage in said termination region.

24. The method of claim 19 wherein an orthographic projection of one of said first regions onto said second surface forms a closed figure with rounded corners.

* * * * *